United States Patent
Foster, Sr. et al.

(10) Patent No.: US 7,391,612 B2
(45) Date of Patent: *Jun. 24, 2008

(54) DUAL IMPELLER PUSH-PULL AXIAL FAN SINK

(75) Inventors: Jimmy Grant Foster, Sr., Morrisville, NC (US); Michael Sean June, Raleigh, NC (US); Albert Vincent Makley, Raleigh, NC (US); Jason Aaron Matteson, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/940,108

(22) Filed: Nov. 14, 2007

(65) Prior Publication Data

US 2008/0068800 A1   Mar. 20, 2008

Related U.S. Application Data

(63) Continuation of application No. 11/314,707, filed on Dec. 21, 2005, now Pat. No. 7,324,339.

(51) Int. Cl.
*H05K 7/20* (2006.01)

(52) U.S. Cl. .......................... 361/697; 361/695; 361/82; 165/80.3; 165/121; 165/122; 165/104.21; 165/80.4; 257/712; 257/E23.099; 257/722

(58) Field of Classification Search .................. 361/82, 361/690, 695, 697, 702, 703; 257/718, 719, 257/721, 722; 174/16.3; 165/80.3, 104.34; 415/176, 178
See application file for complete search history.

(56) References Cited

U.S. PATENT DOCUMENTS

| | | | |
|---|---|---|---|
| 2,503,072 A | | 4/1950 | Schneider |
| 2,790,596 A | | 4/1957 | Stirling et al. |
| 3,143,283 A | | 8/1964 | Downs |
| 5,454,695 A | | 10/1995 | Shah et al. |
| 5,755,557 A | | 5/1998 | Alizadeh |
| 5,844,313 A | * | 12/1998 | Hoffmann .................... 257/722 |
| 6,021,844 A | * | 2/2000 | Batchelder ................. 165/80.3 |
| 6,116,856 A | | 9/2000 | Karadgy et al. |
| 6,118,658 A | * | 9/2000 | Nakase ........................ 361/697 |
| 6,599,085 B2 | | 7/2003 | Nadeau et al. |

(Continued)

FOREIGN PATENT DOCUMENTS

JP         5054690 A3    3/1993

*Primary Examiner*—Courtney L Smith
(74) *Attorney, Agent, or Firm*—Cynthia S. Byrd; Dillon & Yudell LLP

(57) ABSTRACT

A fan sink that includes a dual impeller push-pull axial fan and a heat sink to cool a hot electronic device is presented. The axial fan has a hub motor, a first impeller that is radially proximate to the hub motor, and a second impeller that is radially distal to the hub motor, wherein the first impeller pushes air in a first direction and the second impeller pulls air in a second direction. The heat sink is oriented between the axial fan and the hot electronic device such that the hot electronic device, the heat sink, and the axial fan are axially oriented, wherein cool air is forced onto the heat sink by one impeller in the axial fan, and wherein heated air from the heat sink is removed by an other impeller in the axial fan.

3 Claims, 10 Drawing Sheets

U.S. PATENT DOCUMENTS

| | | | |
|---|---|---|---|
| 6,659,169 B1 * | 12/2003 | Lopatinsky et al. | 165/121 |
| 7,019,969 B2 * | 3/2006 | Foster et al. | 361/695 |
| 7,044,202 B2 * | 5/2006 | Lopatinsky et al. | 165/122 |
| 7,051,791 B2 * | 5/2006 | Hashimoto et al. | 165/80.3 |
| 7,120,019 B2 * | 10/2006 | Foster et al. | 361/695 |
| 7,184,268 B2 * | 2/2007 | Espinoza-Ibarra et al. | 361/695 |
| 2002/0122724 A1 | 9/2002 | Tseng | |
| 2002/0162647 A1 * | 11/2002 | Wagner | 165/121 |
| 2003/0044283 A1 | 3/2003 | Nadeau et al. | |
| 2005/0145366 A1 * | 7/2005 | Erel | 165/80.3 |
| 2006/0039110 A1 * | 2/2006 | Foster et al. | 361/697 |
| 2006/0213643 A1 * | 9/2006 | Hashimoto et al. | 165/80.3 |

* cited by examiner

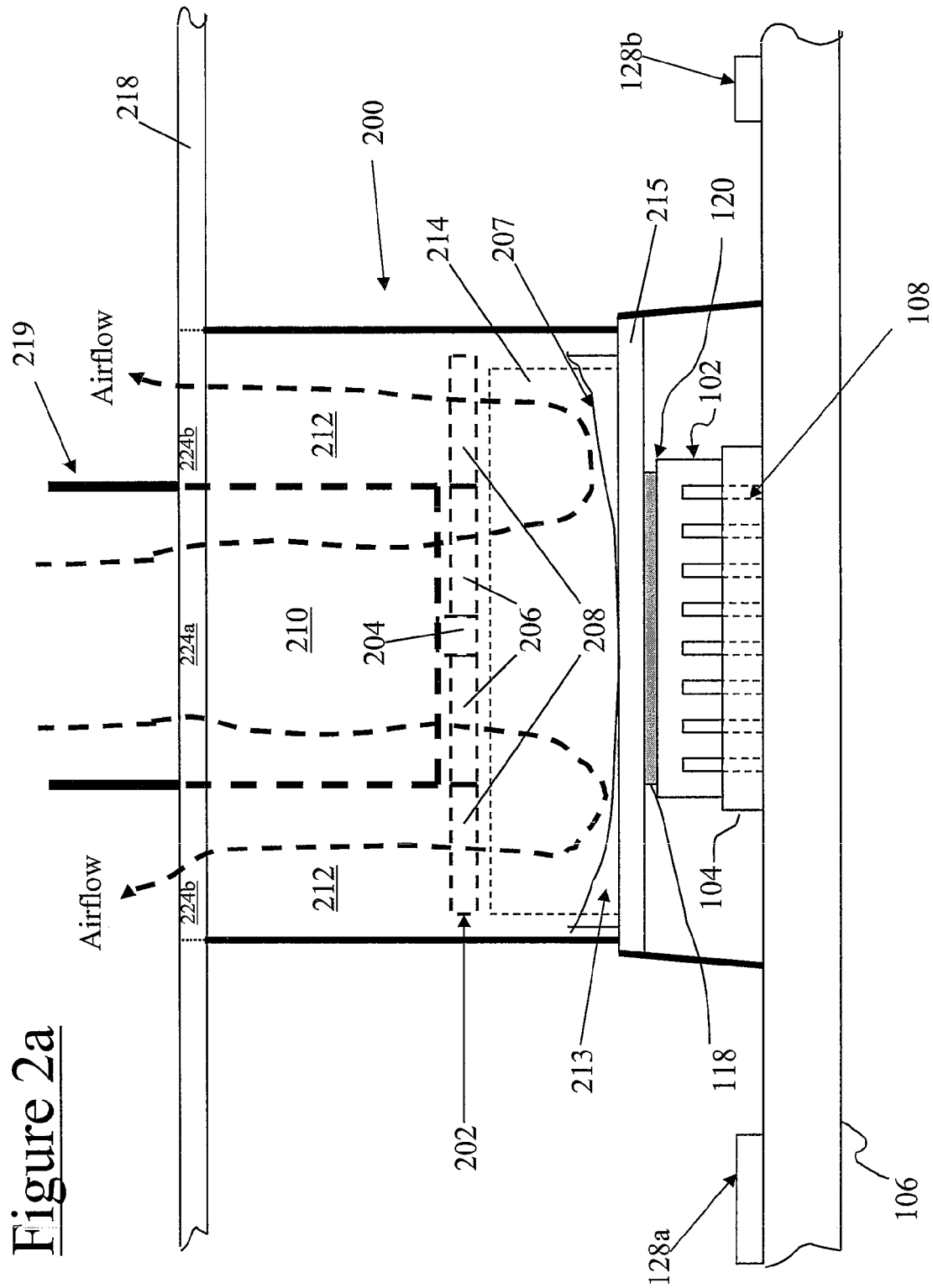

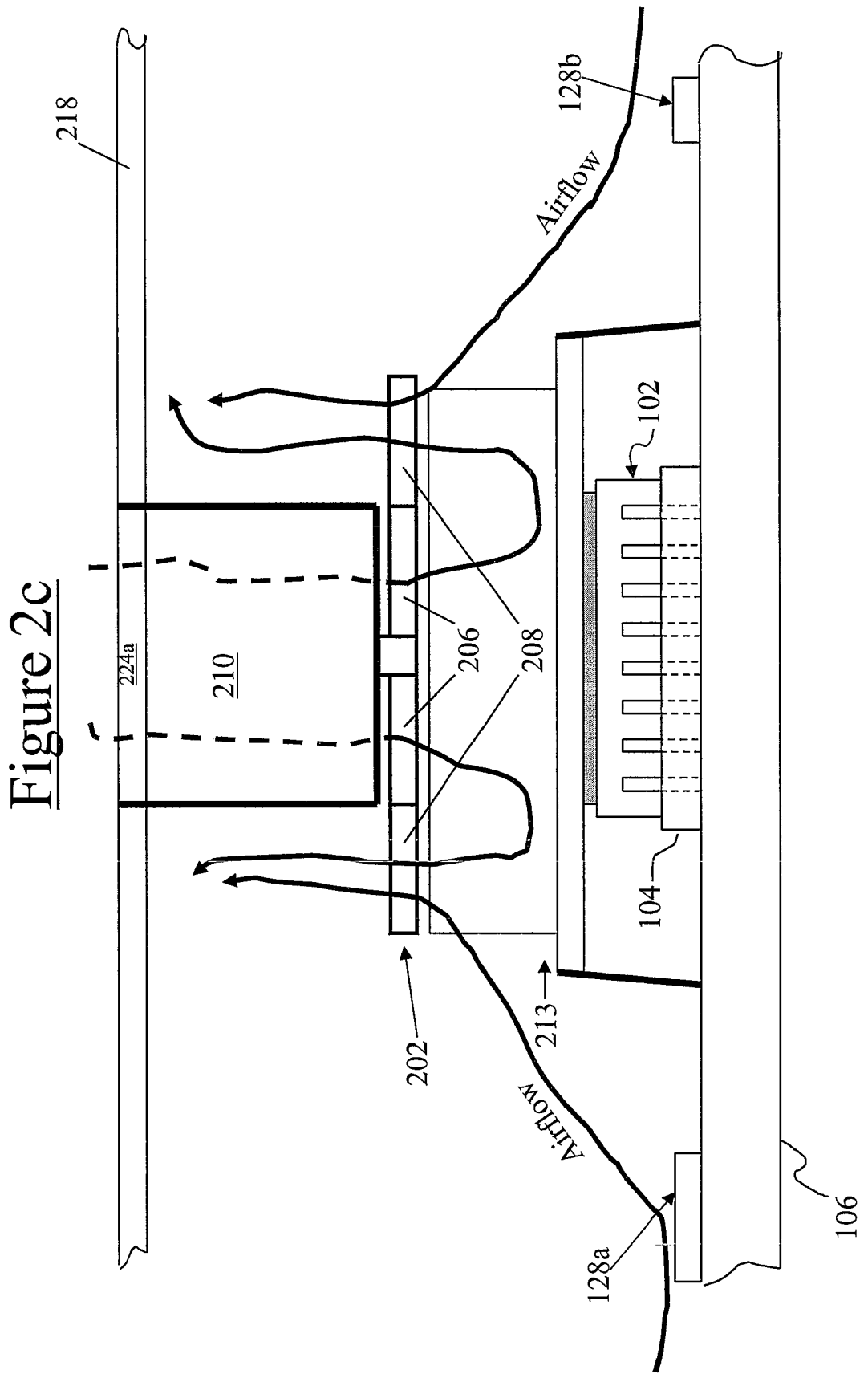

DUAL IMPELLER PUSH-PULL AXIAL FAN SINK

PRIORITY CLAIM

The present application is a continuation of U.S. patent application Ser. No. 11/314,707, filed on Dec. 21, 2005, now U.S. Pat. No. 7,324,339 and entitled, "Dual Impeller Push-Pull Axial Fan Heat Sink," which is incorporated herein by reference.

BACKGROUND OF THE INVENTION

1. Technical Field

The present invention relates in general to the field of electronics, and in particular to electronic chips that generate extraneous heat during normal operation. More particularly, the present invention relates to a method and system for removing heat from an integrated circuit using a dual impeller push-pull axial fan.

2. Description of the Related Art

In a typical personal computer (PC), the main heat-generating component among the logic circuits is the processor, also referred to as the Central Processing Unit (CPU) or microprocessor (MP). As illustrated in FIG. 1a, a processor 102 is mounted in a socket 104, which is mounted on a (printed) circuit board 106 by mating pins 108 from the processor 102 into the socket 104. As processors continue to grow in performance, so does the heat generated by the processors.

To remove heat from processor 102, a heat sink (HS) 110, having a HS base 112 and a plurality of fins 114, is secured to processor 102 by a strap 116 or other attachment means. Heat is conducted from the processor 102 to the HS base 112 and the fins 114, which dissipate heat by conduction and convection to ambient air surrounding fins 114. To provide thermal conduction between a top surface 120 of processor 102 and the HS base 112, thermal grease 118, typically a thermally conductive silicon or filled hydrocarbon grease doped with fillings such as metals, is used.

A major problem with the heat sink 110 shown in FIG. 1a is that it relies on conduction to the ambient air, which may or may not be moving enough to significantly convey away heat from the fins, depending on movement of air about the heat sink caused by fan(s) in a computer case (not shown) that houses the processor 102. To aid in this air movement, a heat sink fan 122, as shown in FIG. 1b, is often used. Heat sink fan 122 includes fan blades 124, which rotate about a hub 126, causing air to be forced down across fins 114 and against HS base 112.

A major problem with the system shown in FIG. 1b is that heated air (having passed across fins 114) continues to flow past other ICs 128a-b that are mounted on circuit board 106 near processor 102. Thus, while processor 102 may be cooled, it is at the expense of the other ICs 128 that are being additionally heated.

SUMMARY OF THE INVENTION

The present invention is therefore directed to a fan sink that includes a dual impeller push-pull axial fan and a heat sink to cool a hot electronic device. The axial fan has a hub, a first impeller that is radially proximate to the hub, and a second impeller that is radially distal to the hub, wherein the first impeller pushes air in a first direction and the second impeller pulls air in a second direction. The heat sink is oriented between the axial fan and the hot electronic device such that the hot electronic device, the heat sink, and the axial fan are axially oriented, wherein cool air is forced onto the heat sink by one impeller in the axial fan, and wherein heated air from the heat sink is removed by an other impeller in the axial fan.

The above, as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further purposes and advantages thereof, will best be understood by reference to the following detailed description of an illustrative embodiment when read in conjunction with the accompanying drawings, where:

FIGS. 2a-e depicts various configurations of novel fan sinks that use a dual impeller push-pull fan to cool an IC chip package.

DETAILED DESCRIPTION OF A PREFERRED EMBODIMENT

Figure 1A:
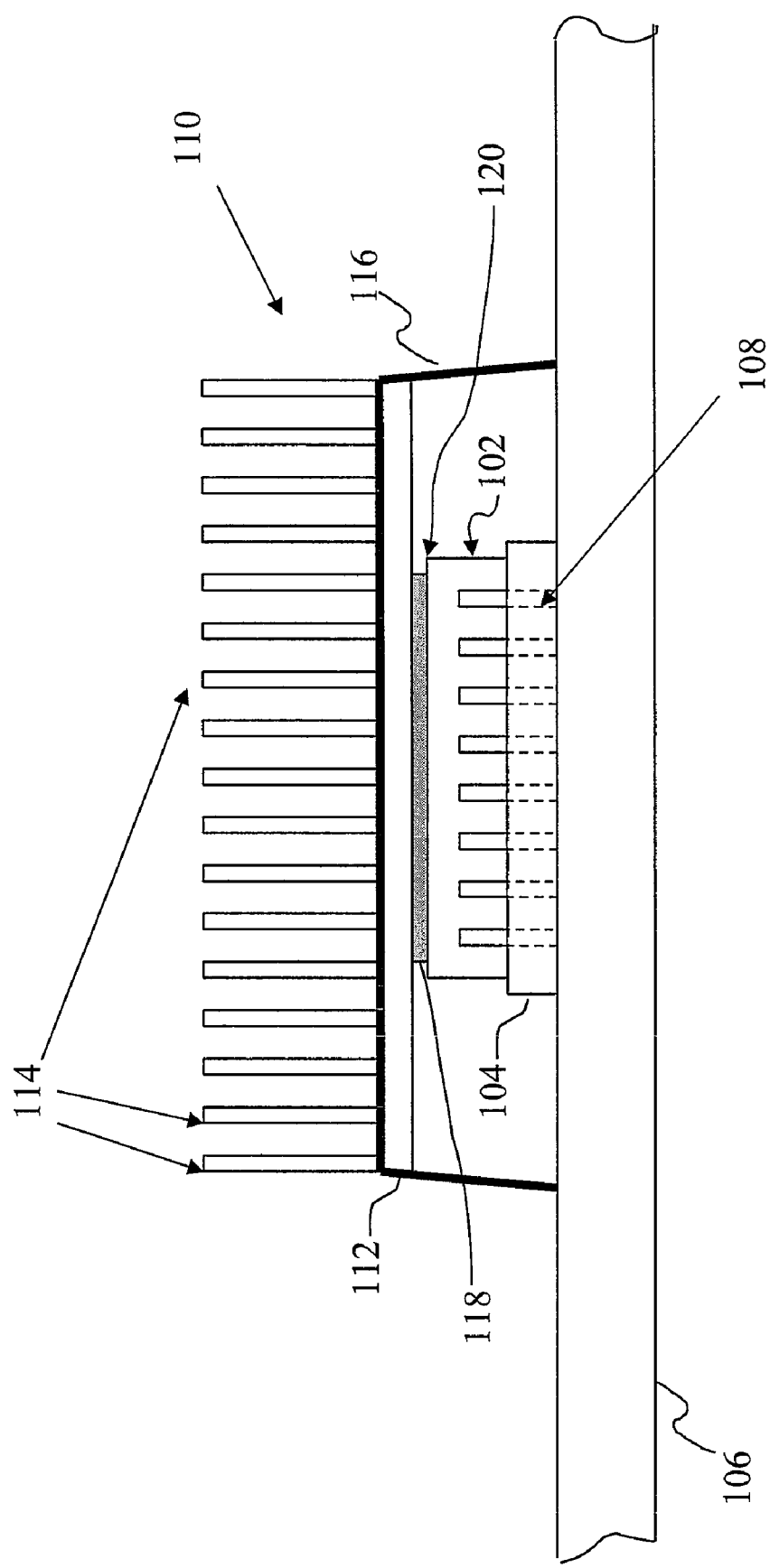
FIG. 1a depicts a prior art heat sink mounted against an integrated circuit (IC) chip package.
Figure 1B:
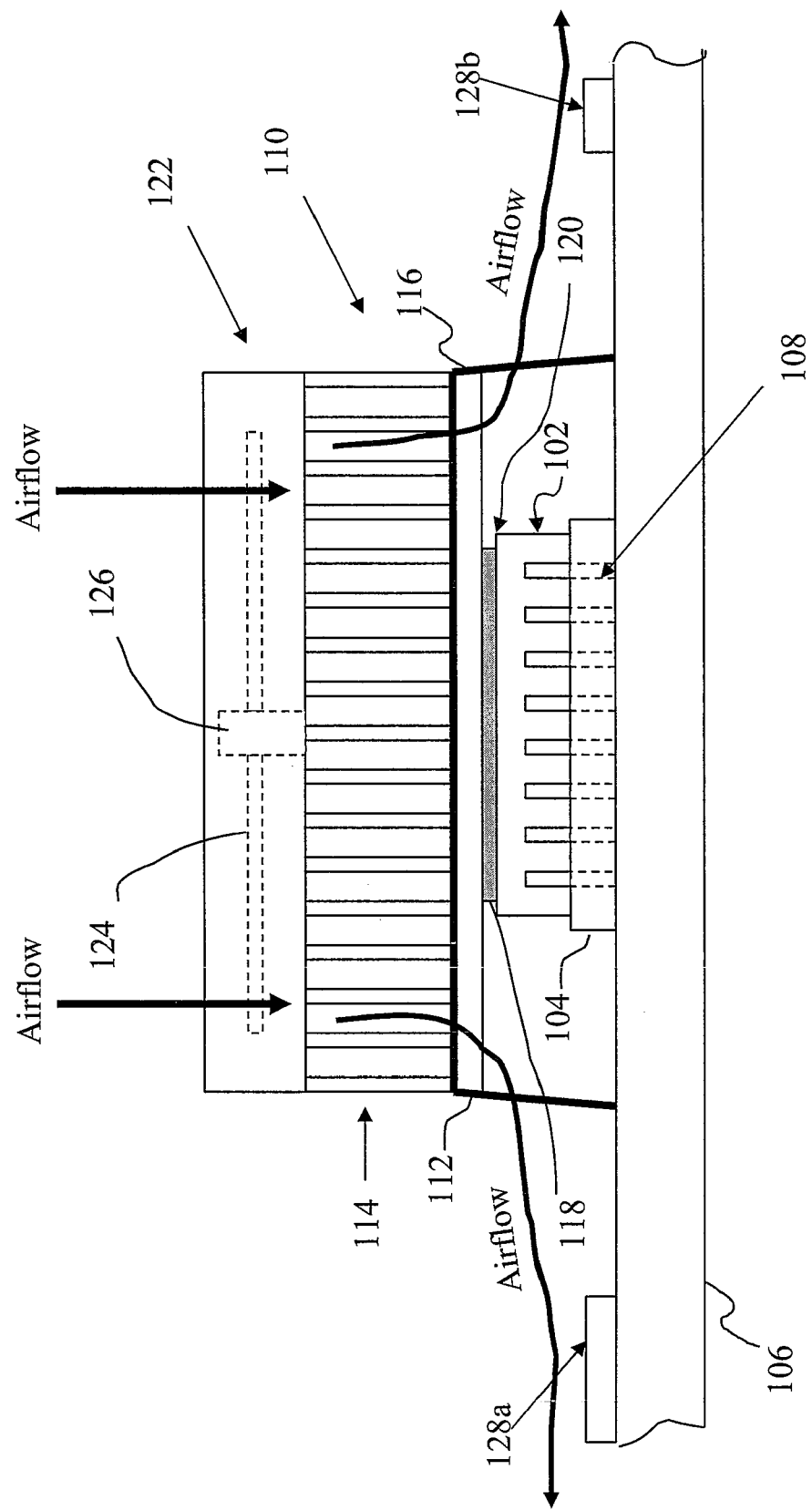
FIG. 1b illustrates the prior art heat sink with a conventional heat sink fan.

In accordance with a preferred embodiment of the present invention, and with reference now to FIG. 2a, a side view of a cross-section of a fan sink 200 is depicted. Fan sink 200 includes a dual-impeller push-pull axial fan 202, which is supported and rotated by a hub motor 204, such that hub motor 204 turns a first impeller 206 and a second impeller 208. Alternatively, hub motor 204 may actually be only a hub, with rotational force being supplied by another mechanical means (not shown).

First impeller 206 is radially proximate to hub motor 204, while second impeller 208 is radially distal to hub motor 204. As depicted by the airflow arrows, air is pulled through an opening 224a (in a housing 218) and down an inner duct 210 to reach first impeller 206. The airflow passes across fins 214 of heat sink 213 (which includes heat sink base 215 to which fins 214 are attached). This airflow across fins 214 removes heat from processor 102, which is an exemplary hot device that is in need of cooling.

After passing across fins 214 (and heat sink base 215), the airflow is pulled upwards by second impeller 208, which moves the heated air up an outer duct 212 (which surrounds inner duct 210) and out of opening 224b in housing 218. Thus, the heated air is efficiently exhausted out of the housing 218 of the (e.g., computer) system, thus preventing additional hot air from being blown across nearby ICs 128. Note that in a preferred embodiment, opening 224a and opening 224b are separate plenums, such that there is adequate separation between inlet air and outlet air, such that mixing of the inlet air and outlet air is minimized or (preferably) eliminated. even when the inlet air and outlet air are outside of housing 218. Thus, a plenum collar 219 outside housing 218 may be added to prevent such air mixing. Alternatively, inner duct 210 may be extended through opening 224a to serve the same described function of plenum collar 219.

Figure 2B:
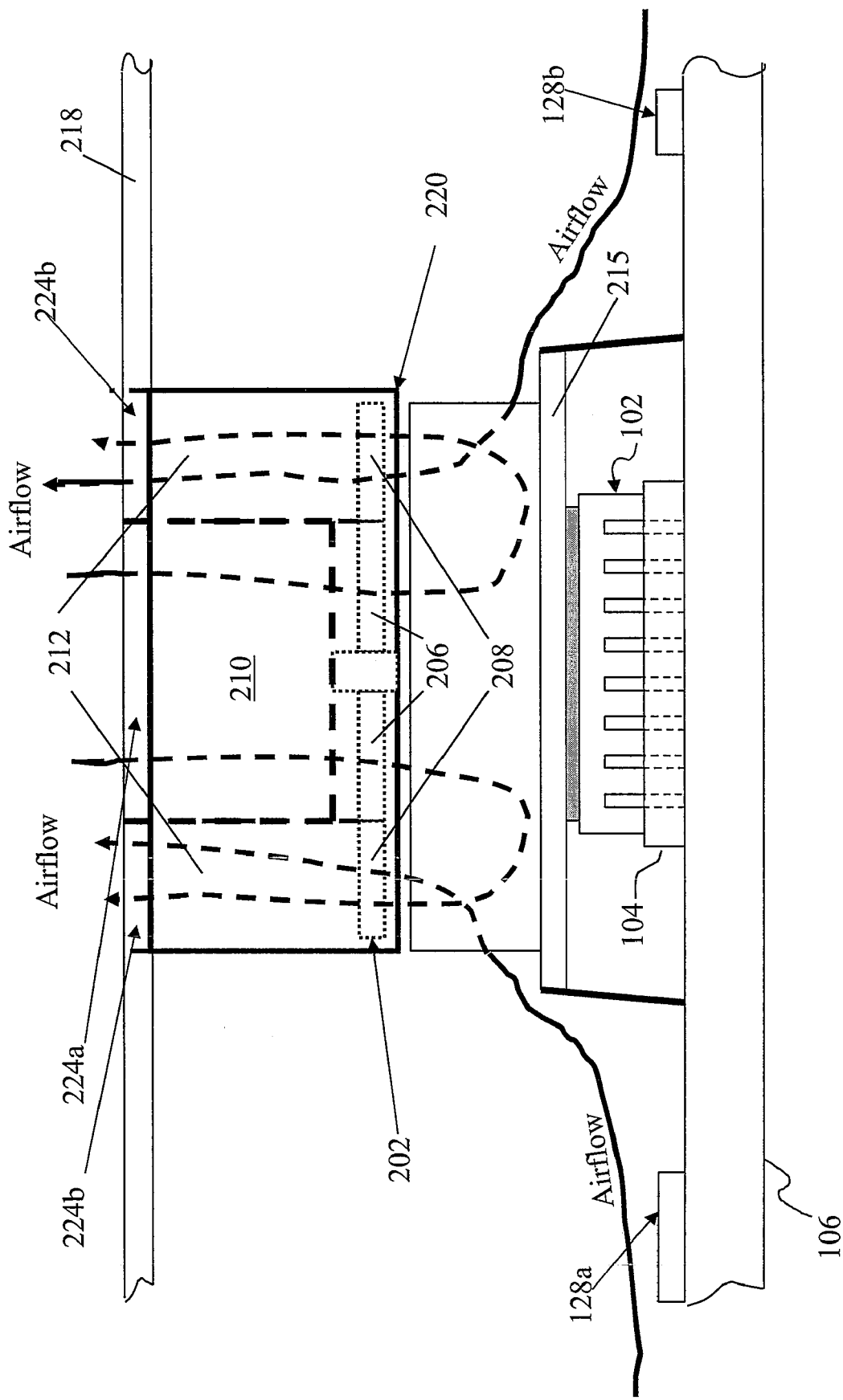

Note that FIG. 2a depicts a balanced system in which first impeller 206 and second impeller 208 move the same amount of air, and in which outer duct 212 is flush against heat sink base 215 such that no air is allowed to enter outer duct 212 except via inner duct 210. FIG. 2b, however, depicts the duct bottom 220 (of outer duct 212 and/or inner duct 210) as being retracted from heat sink base 215, thus permitting airflow to enter from within the interior of housing 218. That is, airflow is now permitted to flow across ICs 128 (from any ambient air source, including not shown vents in housing 218) to be pulled up by second impeller 208 through outer duct 212. This arrangement assumes that the airflow rating of second impeller 208 is higher than that of first impeller 206, such that second impeller 208 can move air from both first impeller 206 as well as from the proximate environment around processor 102.

Note that while the duct bottom 220 is shown as being only slightly recessed, such that axial fan 202 is still surrounded by outer duct 212, alternatively duct bottom 220 can be more recessed such that axial fan 202 is completely exposed (not shown) outside of either inner duct 210 or outer duct 212. Such a configuration would increase the airflow across ICs 128, but would result in additional heat escaping into the interior of housing 218 due to the increased lack of control of air currents about axial fan 202.

Note also that, as shown in FIG. 2a, most (or all) of the top of heat sink base 215 may have a concave surface 207, which aids in the airflow direction shown in FIG. 2a. Concave surface 207 aids in the airflow shown in FIG. 2a, but may limit airflow across nearby ICs 128, and thus preferably concave surface 207 is used when outer duct 212 is flush against heat sink base 215 as shown in FIG. 2a.

Another embodiment of the presently presented fan sink 200 is presented in FIG. 2c, in which outer duct 212 is missing, leaving only inner duct 210 to pull air through opening 224a to reach first impeller 206. As shown, second impeller 208 continues to pull air back away from heat sink 213 and neighboring ICs 128, but the heated air is now left to circulate within housing 218 until a vent opening (not shown) in housing 218 is found.

Figure 2D:
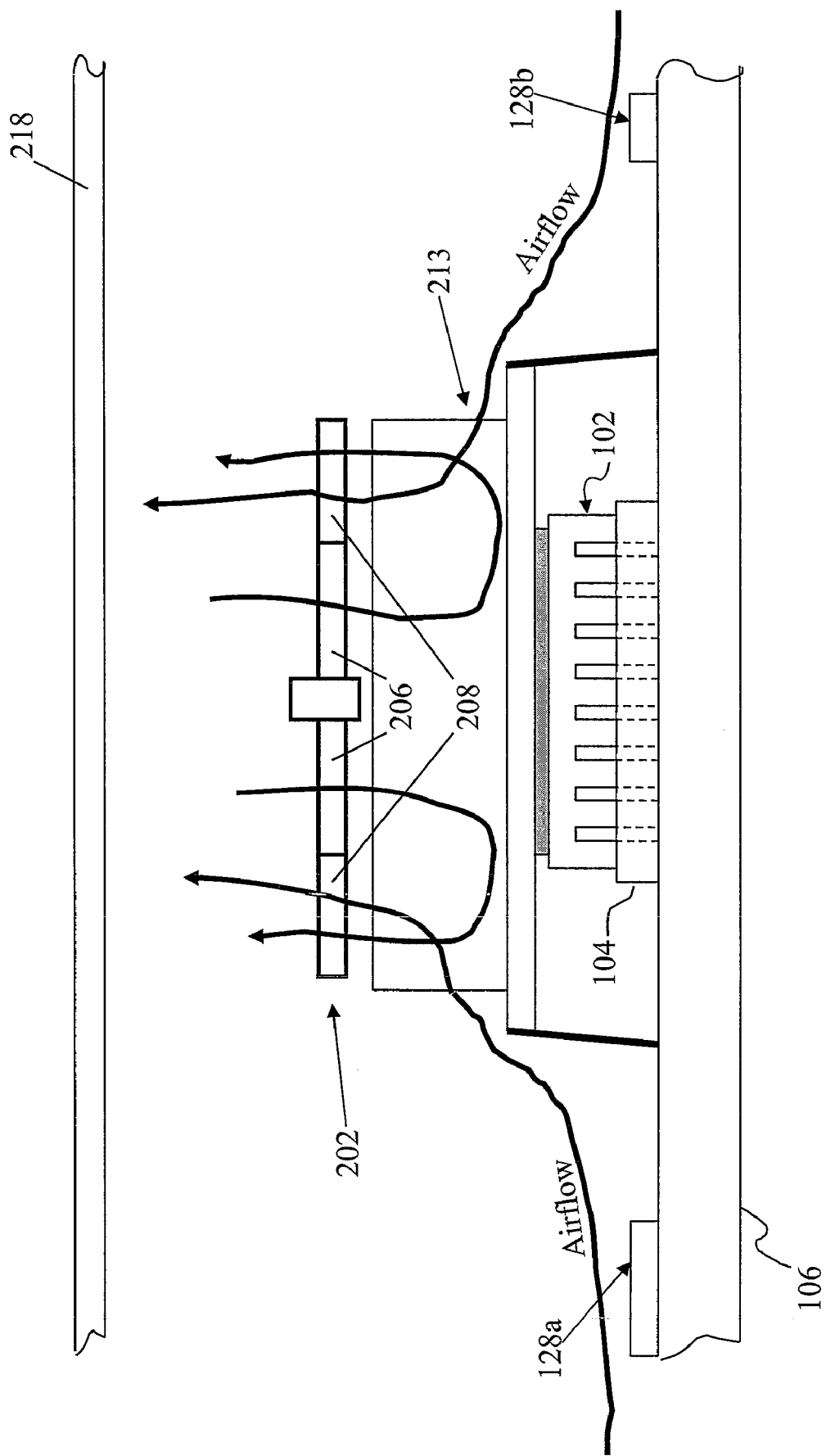

Another less attractive embodiment is presented in FIG. 2d, in which no ductwork is provided. Axial fan 202 continues to move air away from heat sink 213 and neighboring ICs 128, but the air supply is from within ambient interior air inside housing 218, and thus the provided cooling air is likely warmer than when an inner duct 210 is used.

Figure 2E:
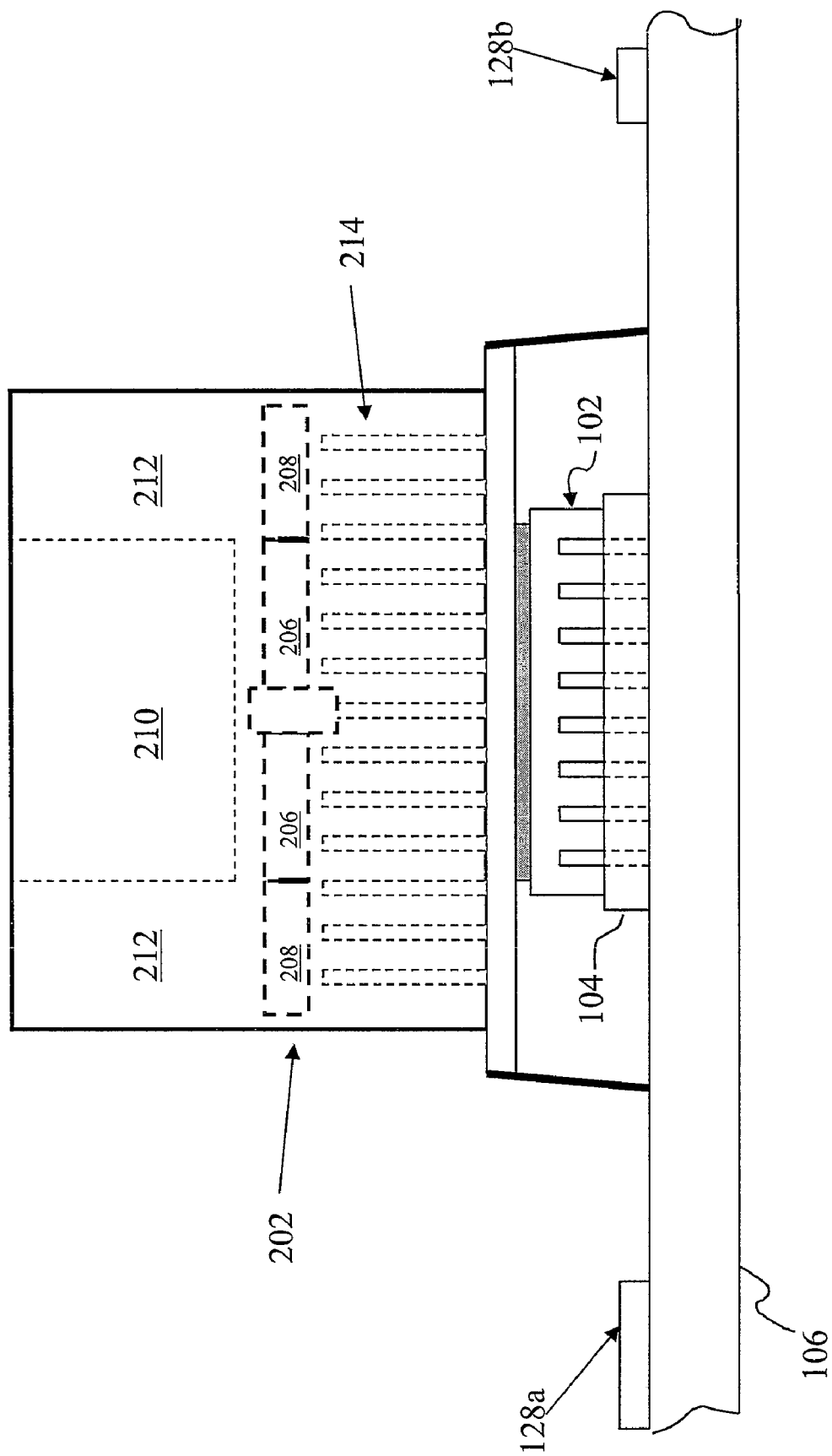

FIG. 2e presents another side view that is orthogonal to that shown in FIGS. 2a-d, and in particular FIG. 2a. Note the plurality of fins 214, between which the previously described airflow passes.

As thus depicted in FIGS. 2a-e, then, the heat sink 213 is oriented between axial fan 202 and processor 102 (a hot device) such that the processor 102, heat sink 213, and axial fan 202 are axially oriented, such that cool air is forced onto heat sink 213 by one impeller (first impeller 206) in axial fan 202, while heated air from heat sink 213 is removed by an other impeller (second impeller 208) in axial fan 202. Note further that, in an alternate embodiment, the roles of first impeller 206 and second impeller 208 may be reversed, such that second impeller 208 pulls cool air in and first impeller 206 exhausts hot air away.

Figure 3A:
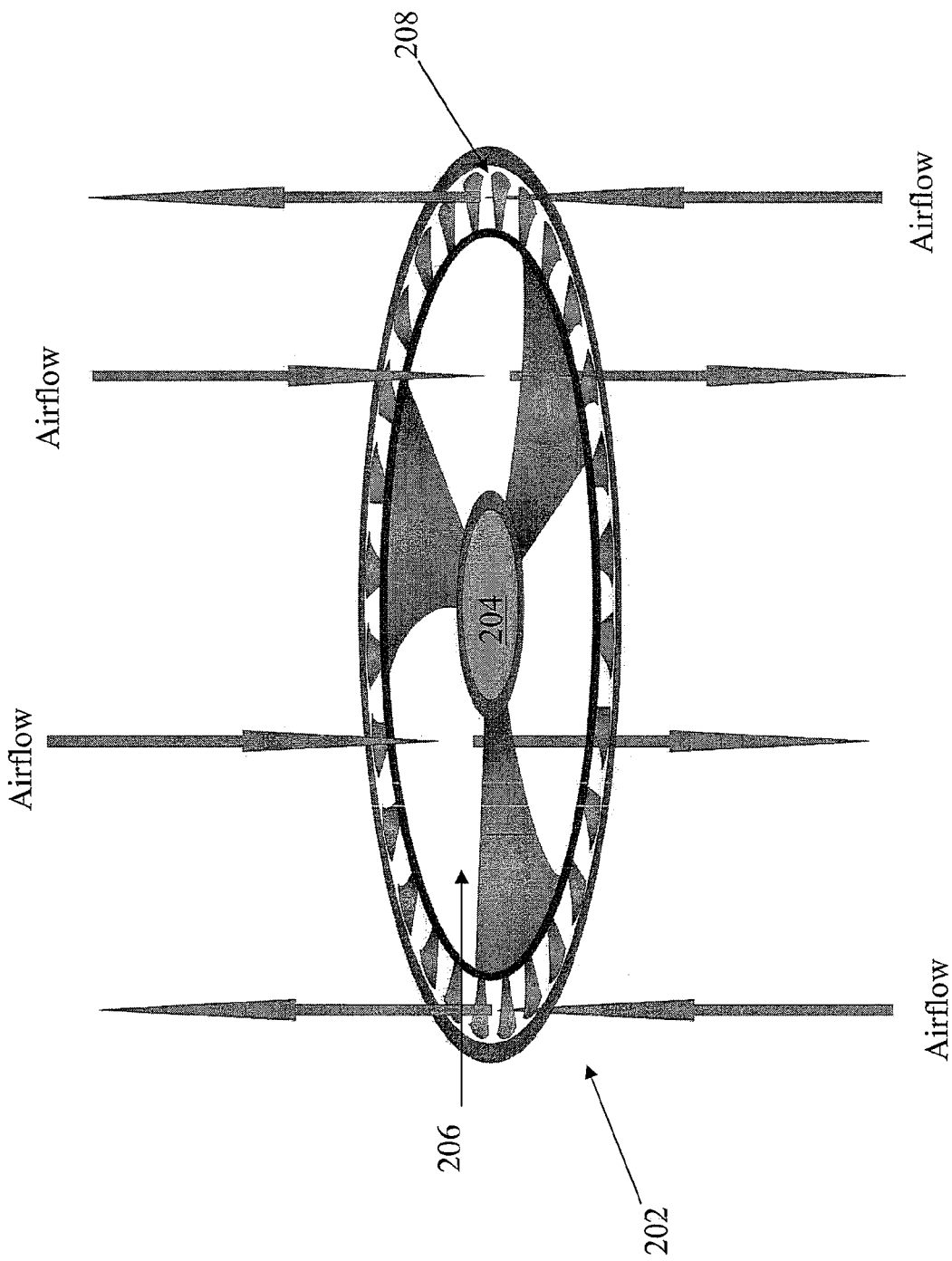
FIGS. 3a-c illustrate additional detail of different types of dual impeller push-pull fans that may be used in the novel fan sinks.

With reference now to FIG. 3a, additional detail of axial fan 202 is presented. As depicted, first impeller 206 is radially proximate to hub motor 204 (which alternately may simply be a hub, assuming that other means of rotation of axial fan 202 are provided), and second impeller 208 is radially distal to hub motor 204.

Figure 3B:
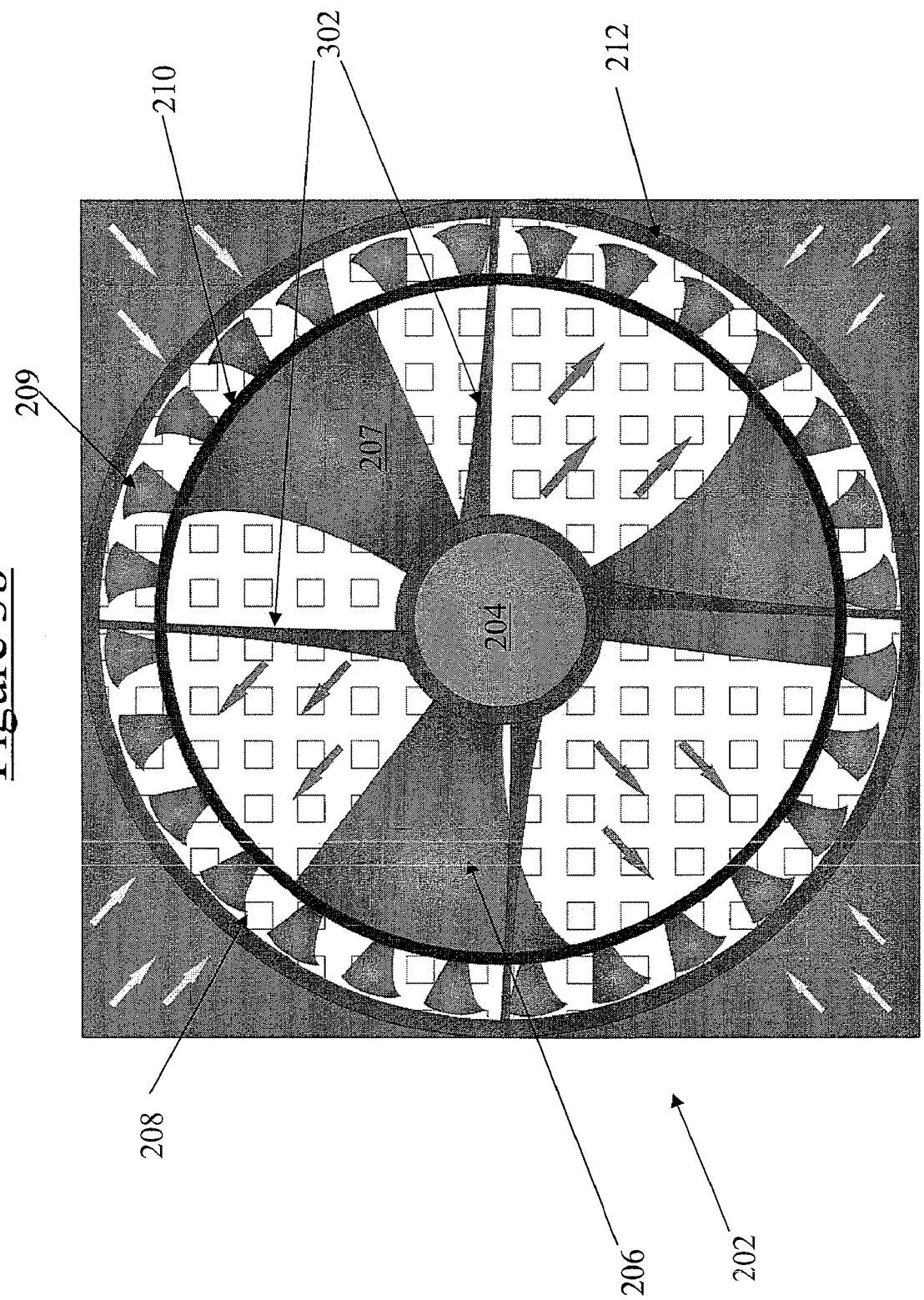
Figure 3C:
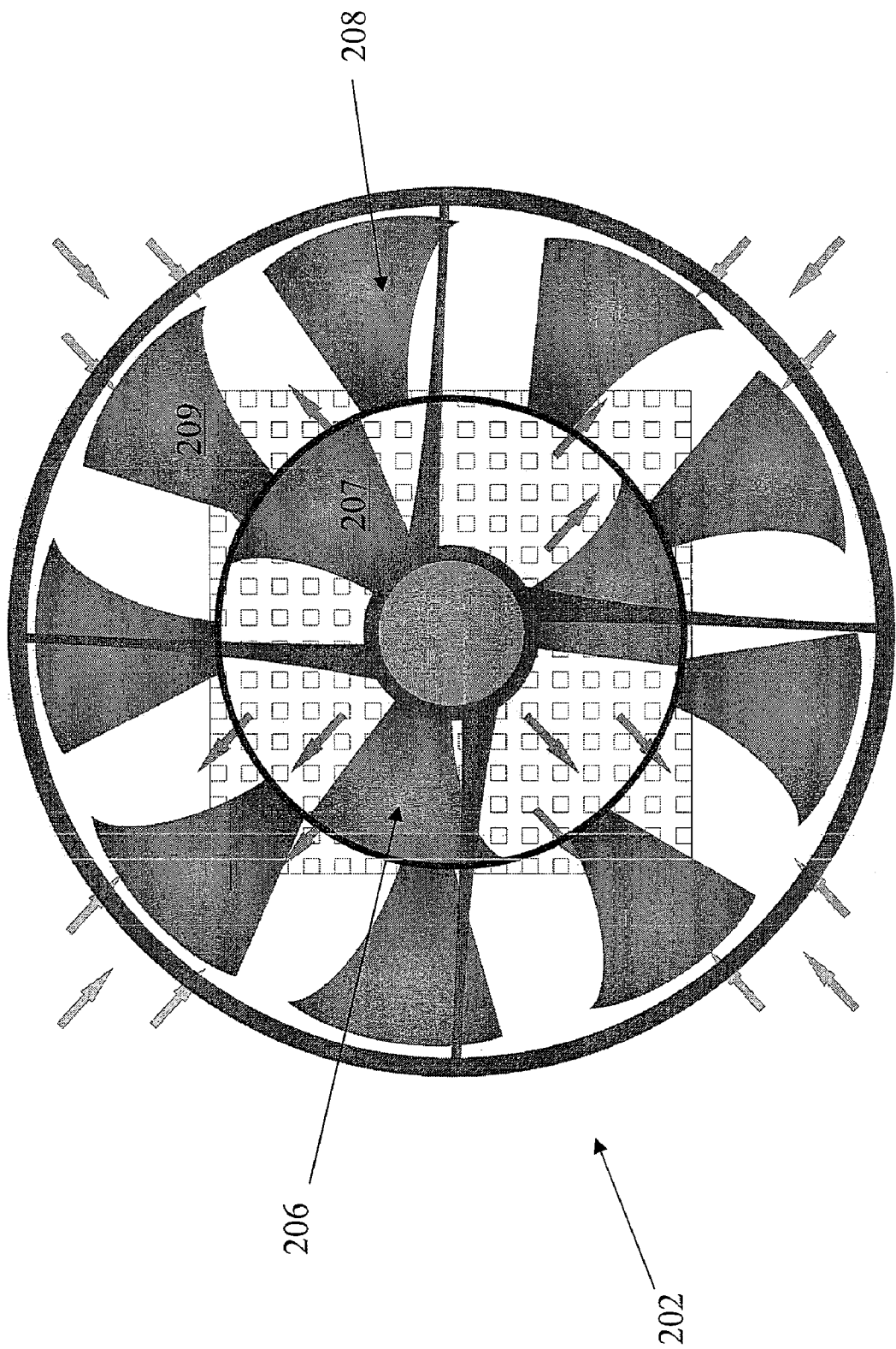

FIG. 3b presents a top view of axial fan 202. As depicted, hub motor 204 is supported by hub supports 302 that are attached to the walls of outer duct 212. Alternatively, hub supports 302 may be secured to the walls of inner duct 210. As depicted by the arrows, air flows to second impeller 208 from both first impeller 206 and surrounding air, as described in FIGS. 2b-d. Note also that first impeller 206 has fewer but larger fan blades 207, while second impeller 208 has more but smaller fan blades 209. By properly angling fan blades 207 and 209, the proper airflow balance can be achieved such that the airflow described above is achieved. Alternatively, as shown in FIG. 3c, fan blades 207 and 209 are the same size. Again, however, these fan blades should be angled, tilted and shaped such the desired airflow as described above is achieved.

While the invention has been particularly shown and described with reference to a preferred embodiment, it will be understood by those skilled in the art that various changes in form and detail may be made therein without departing from the spirit and scope of the invention. For example, while the present invention has been described in removing heat from a processor, the inventive fan heat sink (having a dual impeller push-pull axial fan) is useful in removing heat from any heat generating device, and particularly any heat generating integrated circuit package.

Note further that while terms such as "above" and "beneath," "push" and "pull," etc., may have been used herein to describe the spatial orientation and movement, such terms are used generically, and the present invention as described and claimed is to include orientations and movements so generally described, but not limited to such "up/down," "top/bottom," and "push/pull" descriptions.

What is claimed is:

1. A fan sink comprising:
an axial fan, the axial fan having:
a hub,
a first impeller that is radially proximate to the hub, and
a second impeller that is radially distal to the hub, wherein the first impeller pushes air in a first direction and the second impeller pulls air in a second direction; and
a heat sink oriented between the axial fan and a hot device such that the hot device, the heat sink, and the axial fan are axially oriented, wherein cool air is forced onto the heat sink by one impeller in the axial fan, and wherein heated air from the heat sink is removed by an other impeller in the axial fan, and wherein a top surface of the heat sink has a concave surface that aids an airflow direction caused by the first and second impellers, wherein the axial fan is mounted to the heat sink without any ductwork surrounding the axial fan, and wherein ambient air flows freely through the second impeller from an interior of a housing that holds the hot device, and wherein the first impeller has only large fan blades, and wherein the second impeller has only small fan blades, and wherein the large fan blades are larger than the small fan blades, and wherein the first impeller has fewer large fan blades compared to a quantity of small fan blades in the second impeller;
a first interior duct that is aligned axially with the first impeller to bring the cool air in from outside a housing of the system; and
a second interior duct that circumscribes the first interior duct, wherein the second interior duct is aligned axially with the second impeller to exhaust hot air outside the housing of the system, wherein the first and second impellers are only supported by the hub, and wherein rotational force to the first and second impellers is supplied by a separate mechanical means.

2. The fan sink of claim 1, wherein the hot device is an electronic component in the system.

3. The fan sink of claim 1, wherein the heat sink further comprises:

a plurality of fins, wherein air moving from the first impeller towards the second impeller moves across the fins.

* * * * *